United States Patent
Steltenpohl

(10) Patent No.: US 7,635,887 B2
(45) Date of Patent: Dec. 22, 2009

(54) INTEGRATED CIRCUIT ARRANGEMENT WITH CAPACITOR IN AN INTERCONNECT LAYER AND METHOD

(75) Inventor: Anton Steltenpohl, Munich (DE)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 11/502,815

(22) Filed: Aug. 11, 2006

(65) Prior Publication Data

US 2007/0117340 A1 May 24, 2007

(30) Foreign Application Priority Data

Aug. 12, 2005 (DE) ............ 10 2005 038 219

(51) Int. Cl.
*H01L 29/94* (2006.01)
(52) U.S. Cl. .............. 257/306; 257/307; 257/308; 257/309; 257/298; 257/301; 257/302; 257/303; 257/E27.016; 257/E27.048; 438/397
(58) Field of Classification Search ........ 257/306–309, 257/298, 301–303, E27.016, E27.048; 438/397
See application file for complete search history.

(56) References Cited

U.S. PATENT DOCUMENTS

| 6,620,701 | B2 | 9/2003 | Ning | |
|---|---|---|---|---|
| 6,646,323 | B2 * | 11/2003 | Dirnecker et al. | 257/532 |
| 6,765,255 | B2 * | 7/2004 | Jin et al. | 257/301 |
| 7,067,869 | B2 * | 6/2006 | Cheng et al. | 257/301 |
| 7,479,424 | B2 * | 1/2009 | Giraudin et al. | 438/243 |
| 2002/0163029 | A1 | 11/2002 | Dirnecker et al. | |
| 2003/0098484 | A1 | 5/2003 | Kim | |
| 2003/0155603 | A1 | 8/2003 | Liu et al. | |
| 2003/0211731 | A1 * | 11/2003 | Kai et al. | 438/638 |
| 2004/0113235 | A1 | 6/2004 | Coolbaugh et al. | |

FOREIGN PATENT DOCUMENTS

DE 102 47 454 A1 5/2003

* cited by examiner

*Primary Examiner*—Charles D. Garber
*Assistant Examiner*—Hajar Kolahdouzan
(74) *Attorney, Agent, or Firm*—Brinks Hofer Gilson & Lione

(57) ABSTRACT

An integrated circuit arrangement includes an undulating capacitor in a conductive structure layer. The surface area of the capacitor is enlarged in comparison with an even capacitor. The capacitor is interlinked with dielectric regions at its top side and/or its underside, so that it can be produced by methods which may not have to be altered in comparison with conventional CMP methods.

18 Claims, 7 Drawing Sheets

FIG 3  A-A'

INTEGRATED CIRCUIT ARRANGEMENT WITH CAPACITOR IN AN INTERCONNECT LAYER AND METHOD

PRIORITY CLAIM

This application claims the benefit of priority from German Patent Application No. DE 10 2005 038 219.3, filed Aug. 12, 2005, the contents of which are incorporated by reference in its entirety herein.

BACKGROUND

1. Technical Field

The invention relates to an integrated circuit arrangement containing a substrate. In particular, the invention relates to an integrated circuit arrangement with a capacitor in an interconnect layer.

2. Background Information

In copper metallizations produced by the damascene method, the conductive structure layers in each case have even bottom areas and even top areas. This arrangement applies to aluminum metallizations produced using polishing methods. Copper metallizations comprise copper or a copper alloy with at least 90 atomic percent copper. Aluminum metallizations comprise aluminum or an aluminum alloy with at least 90 atomic percent aluminum. The conductive structures are differentiated for example as vias for vertical current transport and interconnects for lateral current transport.

BRIEF SUMMARY

A multiplicity of integrated semiconductor components, for example field effect transistors or bipolar transistors, are arranged in or at the substrate. The integrated circuit arrangement additionally contains conductive structure layers containing a plurality of conductive structures.

The integrated circuit arrangement additionally contains a capacitor containing a bottom electrode, a capacitor dielectric and a top electrode. In particular, the capacitor is a so-called MIM capacitor (metal insulator metal), that is, a capacitor comprising a metallic bottom electrode, a capacitor dielectric and a metallic top electrode.

The surface area of the capacitor can be enlarged with the contour remaining the same by creating topology differences, such as by creating projections and cutouts.

An integrated circuit arrangement with a capacitor having an enlarged surface area is disclosed. The capacitor can be produced in a metallization.

The circuit arrangement according to the disclosure contains a plurality of conductive structures and the interspaces between them or a plurality of cutouts contained in a conductive structure, which form an uneven area. The uneven area is enlarged by at least 30 percent or at least 50 percent or at least by 200 percent in comparison with an even area having the same contour as the capacitor. The bottom electrode of the capacitor bears directly on the uneven area, that is to say that it adjoins said area and thus adjoins the conductive structures. The conductive structures, which usually have very low impedance, thus also serve as connection of the bottom electrode.

The conductive structures are produced in a damascene method or a subtractive patterning method for patterning aluminum or an aluminum alloy, which method simultaneously serves for producing other conductive structures of the conductive structure layer in which the capacitor is also arranged. The other conductive structures are e.g. interconnects that do not lead to a capacitor. It is thus possible to utilize method steps that are required anyway for producing the topology for the capacitor. Process step sequences that have been used hitherto can be maintained because electrically insulating material is situated directly beneath the conductive structures that produce the unevenness. This has not been possible in a straightforward manner hitherto in particular for damascene methods.

The capacitors according to the disclosure are used in particular for radiofrequency applications at frequencies of greater than 400 MHz. The dielectrics used are dielectrics having a layer thickness of less than 70 nm, for example, or even less than 30 nm. Use is made not only of dielectrics having a dielectric constant within the range of 3.5 to 8 but also of dielectrics having a dielectric constant of greater than 8. The requirements made of the reproducibility of a specific capacitance and the yield are particularly stringent in the case of capacitors for radiofrequency applications and for logic applications.

In one development of the circuit arrangement according to the disclosure, a depression is present at that side of the top electrode which faces away from the capacitor dielectric, electrically insulating material or electrically conductive material being arranged in said depression. The electrically conductive material preferably differs from the material of the top electrode with regard to its composition. In particular, a plurality of such depressions are present, for example more than four or more than ten. The depressions arise in the context of methods in which previously customary damascene or other methods for producing a metallization, e.g. made of aluminum, or modified only slightly, for example only by the production of a cutout in the region of the capacitor and also the deposition and, if appropriate, also with regard to the patterning of the capacitor layers.

In an alternative development, a projection is present at that side of the bottom electrode which faces away from the capacitor dielectric, electrically conductive material and electrically insulating material (402) being arranged in said projection. The electrically conductive material preferably differs from the material of the bottom electrode with regard to its composition. This development, too, can be produced by methods which hardly deviate from previously customary damascene methods or other methods for producing a metallization, e.g. also made of aluminum. By way of example, the vertical edge sections of the capacitor that are explained further below arise in the case of this development.

In a next development, the top electrode of the capacitor, in the interspaces or beneath the interspaces or in the cutouts, is arranged nearer to the substrate than the conductive structures adjoining the interspace or adjoining the respective cutout. In particular, the top electrode is arranged more than 50 nm (nanometers), more than 100 nm or even more than 500 nm nearer to the substrate than a bottom area of the adjoining conductive structure. This development can be produced in a simple manner by overetching during the production of the cutout for the capacitor, the conductive structure being used as a hard mask. In this development, insulating regions are arranged beneath the conductive structures between sidewalls formed by the capacitor.

In another development, the bottom electrode, at the edge of the capacitor, lies parallel or only at an angle of less than 10 degrees with respect to a surface of the substrate at or in which the semiconductor components are arranged. To express it using different words, the bottom electrode, at the edge of the capacitor, lies parallel to the conductive structure layer, for example parallel to a top area of the conductive structure layer. In this development, the capacitor is patterned with the aid of a photolithographic method. The additional outlay for the photolithographic step is justified since a precise patterning of the capacitor can be achieved.

In an alternative development, at the edge of the capacitor, the bottom electrode lies transversely with respect to the surface of the substrate, in particular at an angle of greater than 80°. In this development, the capacitor can be patterned with the aid of a planarization method, so that no photolithographic step is required for the patterning of the capacitor.

In one configuration, the vertical section of the bottom electrode also projects into a conductive structure layer arranged further away from the substrate than the conductive structure layer that serves for producing the unevenness. This configuration is used both when depressions on that side of the capacitor which is removed from the substrate are filled e.g. with copper-containing material and when said depressions are filled with an electrically insulating material.

In a next development, the conductive structure layer serving for producing the unevenness or topology contains further conductive structures arranged with a lateral offset with respect to the capacitor, that is to say that their topology does not serve for enlarging the surface area of the capacitor or of some other capacitor. In one configuration, the further conductive structures comprise the same material as the conductive structures for producing the topology differences for the capacitor. In a next development, the further conductive structures also have the same thickness as the conductive structures for producing the topology of the capacitor. The further conductive structures are used for the wiring of the semiconductor components and also for the connection of said semiconductor components to external connections of the integrated circuit arrangement, such as e.g. to bonds or to soldering pads.

In a next development, the bottom electrode and/or the top electrode comprises a metal or a metal alloy, for example ruthenium, titanium, titanium nitride, tantalum, tantalum nitride or tungsten nitride, or layer stacks comprising a plurality of such layers. In one configuration, the thickness of the bottom electrode and/or of the top electrode lies within the range of 10 to 50 nm (nanometers). This range on the one hand affords a sufficient diffusion barrier against the diffusion of copper atoms into the capacitor dielectric. On the other hand, the outlay for the patterning of the capacitor does not become excessively high when complying with said range. In a next development, the bottom electrode and/or the top electrode has, in particular, a constant layer thickness or at least a layer thickness that does not fall below 5 nm (nanometers).

In a next development, the capacitor dielectric comprises an oxide or a nitride, in particular silicon oxide, silicon nitride, tantalum oxide, aluminum oxide or hafnium oxide. However, use is also made of so-called perovskites, for example barium strontium titanate (BST), or similar materials. In one configuration, the thickness of the capacitor dielectric lies within the range of 10 nm to 100 nm in order to achieve a high capacitance per unit area of the capacitor that is in particular greater than 0.5 femtofarad/µm2 (square micrometer) or greater than 1 femtofarad/µm2. In one development, the thickness of the capacitor dielectric is also constant or fluctuates for example only by a few nanometers in the context of the production tolerances. Suitable layer deposition methods for depositing the layers of the capacitor are e.g. Chemical Vapor Deposition (CVD) methods or Atomic Layer Deposition (ALD) methods.

In a next development, the thickness of the conductive structures lies within the range of 100 nm to 2 µm, the thickness of the conductive structures of the conductive structure layer being constant or fluctuating only by less than 15 percent of the height of the conductive structure layer.

In a next development of the circuit arrangement, the aspect ratio of the conductive structures lies within the range of 1:0.3 to 1:5. In this case, the first value relates to the height or thickness of the conductive structure normalized to the value 1, and the value 0.3 or 5 relates to the value of the minimum dimension of the conductive structure normalized by the same ratio as the thickness. By complying with the range, it is possible to produce conductive structures outside the capacitor with dimensions customary hitherto for interconnects or vias.

In a next development, the aspect ratio of the interspaces or cutouts lies within the range of 1:0.3 to 1:5. The aspect ratios of this range are also aspect ratios which do not unnecessarily impair the production of interconnects that are not associated with the capacitor.

In a next development, the bottom electrode of the capacitor adjoins, in a plurality of sections, a dielectric layer which is also suitable as an etching stop layer and accordingly, comprises a different material than the dielectric which lies between the conductive structures of a conductive structure layer in the lateral direction.

The disclosure furthermore relates to a method for producing a capacitor in an interconnect layer, in particular for producing the capacitor according to the disclosure or one of its developments. The technical effects mentioned above thus apply to the production method as well.

Other systems, methods, features and advantages of the disclosure will be, or will become, apparent to one with skill in the art upon examination of the following figs and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
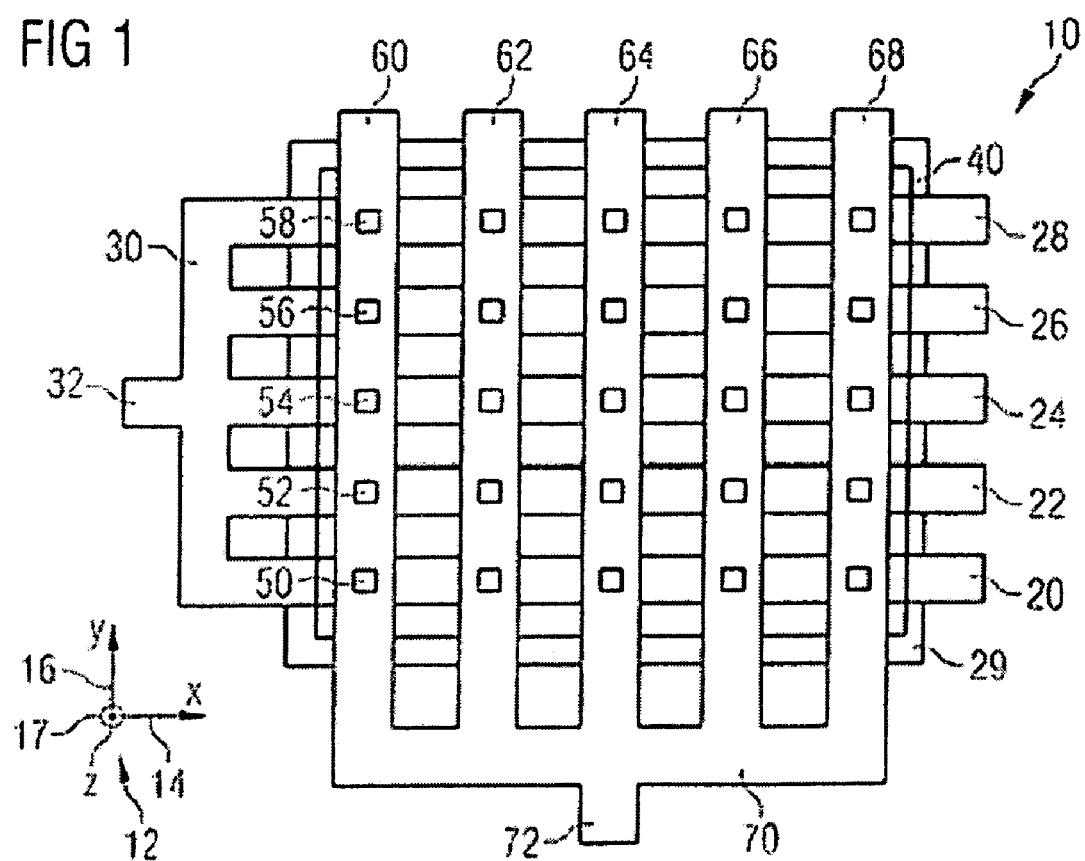
FIG. 1 is a plan view of a capacitor arranged in an interconnect grid.

FIG. 1 shows a plan view of an integrated circuit arrangement 10. A system 12 of Cartesian coordinates has an x axis 14 pointing toward the right in FIG. 1, a y axis 16 pointing upward in FIG. 1, and a z axis 17 pointing out of the plane of the drawing in FIG. 1.

A plurality of interconnects, for example five interconnects 20, 22, 24, 26 and 28, lie at the same level z running parallel to one another in the x direction. The interconnects 20, 22, 24, 26 and 28 comprise copper or a copper alloy, by way of example. Aluminum or an aluminum alloy is used as an alternative, as will be explained in more detail below. A dielectric between the interconnects 20 to 28 has been removed within a cutout 29 in order to arrange a capacitor 40 between the interconnects 20 to 28 as well. The interconnects 20, 22, 24, 26 and 28 lie parallel to one another and have interspaces between adjacent interconnects, e.g. 20 and 22, which are equal to the interconnect width of an interconnect 20, 22 in one system.

A collective interconnect 30 running in the y direction connects the interconnects 20, 22, 24, 26 and 28 at their left-hand ends. A connection interconnect 32 for the connection of the bottom electrode of the capacitor 40 adjoins the central section of the collective interconnect 30. The capacitor 40 contains a bottom electrode near the substrate, a capacitor dielectric and a top electrode, which will be explained in more detail below with reference to cross sections. The top electrode of the capacitor 40 is connected by means of so-called vias situated at crossover points between the interconnects 20, 22, 24, 26 and 28 and interconnects 60, 62, 64, 66 and 68, see for example vias 50, 52, 54, 56, and 58 located e.g. at crossover points between the interconnect 60 and the interconnects 20, 22, 24, 26 and 28. The interconnects 60, 62, 64, 66, and 68 lie at the same level z with respect to one another above the interconnects 20, 22, 24, 26 and 28. The interconnects 60, 62, 64, 66, and 68 also comprise copper or a copper alloy. Aluminum or an aluminum alloy is used as an alternative, as will be explained in more detail below. The interconnects 60, 62, 64, 66, and 68 lie parallel to one another and have interspaces between adjacent interconnects, e.g. 60 and 62 which are equal to the interconnect width of an interconnect 60, 62 in some arrangements. A collective interconnect 70 connects the interconnects 60, 62, 64, 66, and 68 at their bottom ends in FIG. 1. A connection interconnect 72 serving for the connection of the top electrode of the capacitor 40 adjoins the central section of the collective interconnect 70.

In another example arrangement, the interconnects 60, 62, 64, 66, and 68 also extend in the x direction. In this case, the collective interconnect 70 is situated on the left or right of the interconnects 60, 62, 64, 66, and 68.

In another example arrangement, instead of the interconnects 20, 22, 24, 26 and 28 and/or the interconnects 60, 62, 64, 66, and 68, use is made of closed conductive structures lying concentrically with respect to one another, for example circular interconnects or interconnects arranged as rectangular frames, square frames and/or rhombic frames.

Depending on the chosen dimensions of the interconnects 20, 22, 24, 26 and 28, the capacitance of the capacitor 40, with the contour remaining the same, can be increased for example by a factor of 2 or by a larger value or a smaller value. The factor 2 applies to the case in which the height of the interconnects, the minimum dimensions, of the width of the interconnects, and the minimum distances between adjacent interconnects are identical.

Capacitor dielectrics of uniform thickness can be produced by depositing or applying the capacitor dielectric using conformal deposition methods, for example, such as Chemical Vapor Deposition (CVD) or Atomic Layer Deposition (ALD). However, the capacitor dielectric can also be produced with a uniform layer thickness in a different manner, for example by an anodic oxidation.

Figure 2:
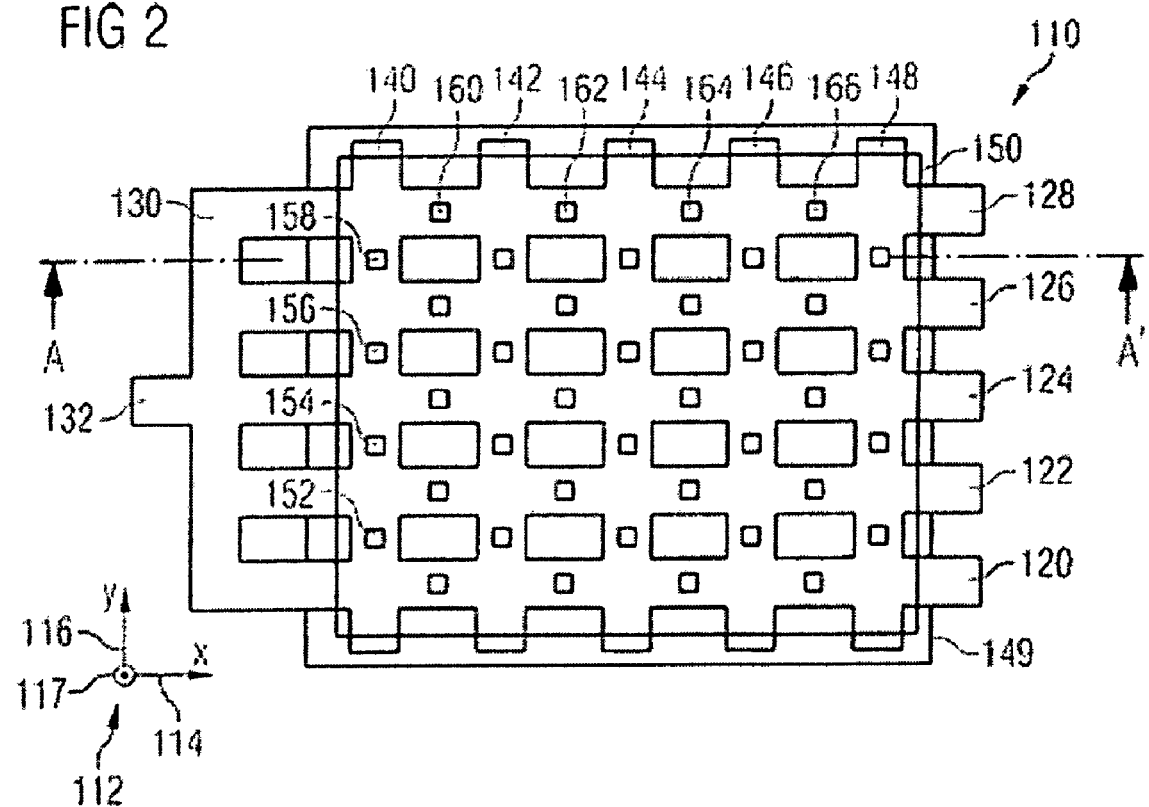
FIG. 2 is a plan view of a capacitor arranged in an interconnect network.

FIG. 2 shows a plan view of an integrated circuit arrangement 110 containing a capacitor 150 in its metallization. In the explanation of the circuit arrangement 110, reference is made to a system 112 of Cartesian coordinates corresponding to the system 12 of coordinates and having an x axis 114, a y axis 116 and a z axis 117. In a reference metallization layer x, interconnects 120, 122, 124, 126 and 128 running in the x direction and interconnects 140, 142, 144, 146 and 148 running in the y direction, at the same level z, form a network. A collective interconnect 130 connects the interconnects 118 to 128 at their left-hand end. A connection interconnect 132 arranged in the x direction ends at the central section of the collective interconnect 130 running in the y direction. An insulating material which is electrically insulating and arranged between the interconnects 120, 122, 124, 126 and 128 and 140, 142, 144, 146 and 148 was removed within a cutout 149 to produce cutouts for a capacitor 150. The cutouts have square or rectangular contours in the exemplary embodiment. In other exemplary embodiments, the cutouts have rhombic or circular contours, by way of example. The cutout 149 is filled again in later processing.

The capacitor 150 has an electrically conductive bottom electrode, an electrically insulating capacitor dielectric, and an electrically conductive top electrode, the contours of which respectively match the contour of the capacitor 150 illustrated in FIG. 2. The top electrode of the capacitor 150 is connected by vias leading to an interconnect layer x+1 lying above the interconnect layer x. The vias are arranged for example in accordance with the grid illustrated in FIG. 2, such as the vias 152, 154, 156, and 158 at the interconnect 140 and the vias 160, 162, 164, 166, and 168 at the interconnect 128. Another possibility of arranging the vias consists in the vias being arranged alternatively or additionally also at the crossover points between the interconnects 120, 122, 124, 126 and 128 and 140, 142, 144, 146 and 148.

In one arrangement, the vias 158, 160, 162, 164 and 166 lead to an upper reticulated conductive structure which has the same contour as the conductive structure comprising the interconnects 120, 122, 124, 126 and 128 and 140, 142, 144, 146 and 148 and lying in the interconnect plane.

The position of a cross section A-A' lying at an angle of 90° with respect to a surface (not illustrated) of a semiconductor substrate of the integrated circuit arrangement 110 can additionally be seen in FIG. 2. The construction of the integrated circuit arrangement 110 at the cross section A-A' is explained in more detail below with reference to FIG. 3.

It is also the case with the arrangement of the capacitor 150 between a network comprising interconnects as shown with reference to FIG. 2 that the capacitance of the capacitor, with the contour remaining the same, can be increased e.g. by a factor of 2 in comparison with a planar capacitor. The sidewalls of the conductive structures increase the area of the capacitor. The series resistance of the bottom electrode and of the top electrode of the capacitor 150 can be reduced in comparison with the arrangement explained with reference to FIG. 1. The methods mentioned with reference to FIG. 1 are used for producing a dielectric having a uniform layer thickness.

Figure 3:
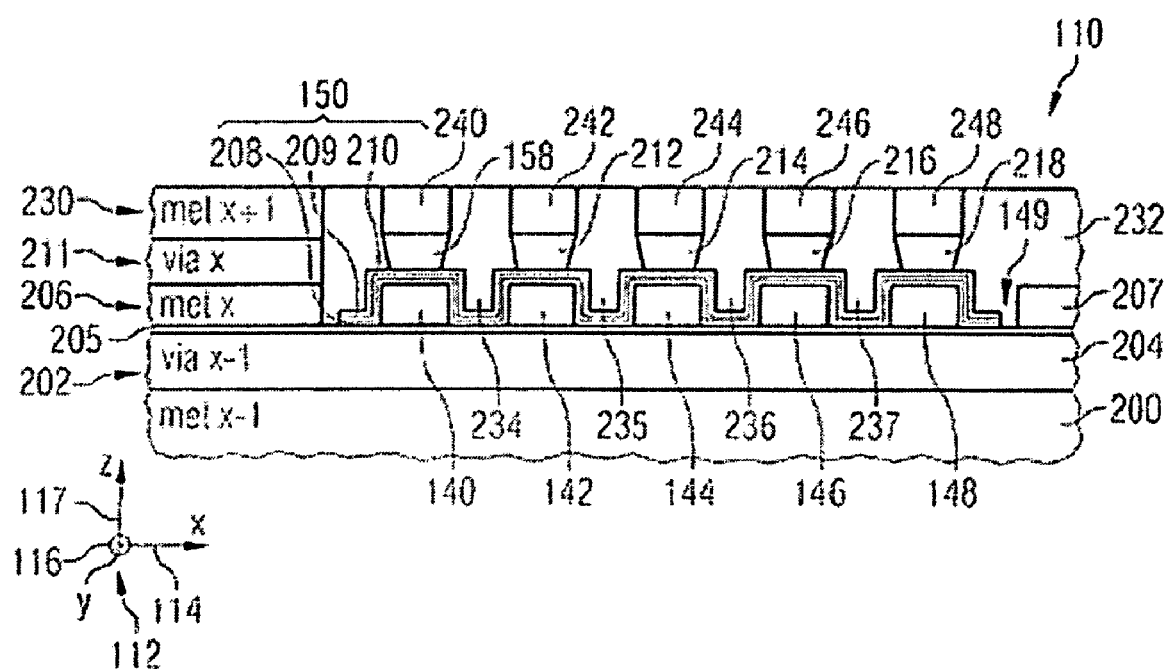
FIG. 3 is a cross section through the capacitor illustrated in FIG. 2, said capacitor having been produced using a photolithographic method for the patterning of the capacitor and an etching stop layer.

FIG. 3 shows the cross section A-A' through the circuit arrangement 110. The circuit arrangement 110 contains a monocrystalline semiconductor substrate (not illustrated), for example a silicon substrate. A multiplicity of electronic semiconductor components, for example field effect transistors, are arranged in the substrate in previous steps. After the fabrication of the semiconductor components and, if appropriate, further contact, interconnect and/or via layers, with the aid of the damascene technique an interconnect layer 200 was produced, which is also referred to as interconnect plane met x−1, where x is a natural number for designating the reference interconnect layer, in which are arranged conductive structures between which the capacitor 150 lies, and which serves for producing the unevenness.

After the production of the interconnect layer 200, a via layer 202 was produced, containing a multiplicity of vias (not illustrated) embedded in a layer dielectric 204.

After a planarization step for planarizing the via layer 202 or via x−1, an etching stop layer 205 was optionally deposited directly on the underlying via layer 202, for example made of silicon nitride. While interconnect layers and via layers have a layer thickness within the range of typically 100 nm to 500 nm or greater, the etching stop layer 205 has a layer thickness within the range of 5 nm to 50 nm, by way of example.

After the deposition of the etching stop layer 205, an insulating layer 207 was deposited for an interconnect layer 206, the insulating layer comprising for example silicon dioxide or a material having a relative dielectric constant of e.g. less than 3.9 or even less than 3. Outside the region of the layer 207 illustrated in FIG. 3 and within the region illustrated in FIG. 3, cutouts for interconnects were produced with the aid of a photolithographic method. Copper interconnects were subsequently produced with an electrolytic deposition method, the interconnects 140 to 148 also having been produced. Barrier materials of the copper conductive structures are not illustrated in the figures. Such barrier materials are present, however, if copper diffusion into surrounding dielectric has to be prevented.

The interconnect layer 206 is subsequently planarized with the aid of a planarization step, e.g. by means of Chemical Metal Polishing (CMP).

With the aid of a further photolithographic method, the cutout 149 was subsequently produced in the insulating layer 207, the procedure having stopped on the etching stop layer 205, so that material of the insulating layer 207 is removed from interspaces between the interconnects 140 to 148. In subsequent processing, the following were deposited in a manner directly adjoining one another: a bottom electrode 208, a capacitor dielectric 209, and a top electrode 210.

With regard to the materials for the bottom electrode 208, for the capacitor dielectric 209 and for the top electrode 210, reference is made to the materials and layer thicknesses mentioned in the introduction to the description. The bottom electrode 208, the capacitor dielectric 209 and the top electrode 210 in each case have a meandering or undulating course along the cross section A-A' illustrated in FIG. 3.

In a subsequent processing, the contour of the capacitor 150 is defined with the aid of a further photolithographic method, the bottom electrode 208, the capacitor dielectric 209 and the top electrode 210 being patterned. During an etching step for patterning the capacitor 150, the procedure stops on the etching stop layer 205, by way of example. The bottom electrode 208, the capacitor dielectric 209 and the top electrode 210 of the capacitor 150 lie parallel to a substrate of the circuit arrangement 110 at the edge of the capacitor 150.

A subsequent process involves depositing dielectric material 232 for a via layer 211 and for an interconnect layer 230, the cutout 149 also being filled, such as insulating material 234, 235, 236 and 237 between the interconnects 140, 142 etc. Thus, the insulating region 234 lies between two areas of the top electrode 210 that face away from the capacitor dielectric, the areas in each case being delimited toward the top by a projecting or concave edge of the capacitor 150b or more precisely of the top electrode 210 and toward the bottom by a recessed or convex edge of the capacitor 150b or of the top electrode 210. The insulating material 232 is subsequently planarized with the aid of a CMP method. The conductive structures in the via layer 211 and also in the interconnect layer 230 are subsequently produced with the aid of a dual damascene method. Vias 212, 214, 216 and 218 leading to the interconnect 142, 144, 146 and 148, respectively, are also produced alongside the via 158. Above the vias 158, 212, 214, 216, and 218, this damascene method also produces interconnects 240, 242, 244, 246 and 248 of the interconnect network that run in the y direction and serve for the connection of the top electrode of the capacitor 150 in the interconnect layer 230, which is also referred to as interconnect layer x+1.

In another example arrangement, the via layer 211 and the interconnect layer 230 are in each case produced by a single damascene method. In a further exemplary embodiment, the etching stop layer 205 is not used, and in this case the procedure of etching the cutout 149 stops for example between the interconnects 140, 142, etc. As an alternative, the etching process etches somewhat into the via layer 202, for example by a depth of less than 50 nm.

However, the etching stop layer 205 ensures a highly dimensionally accurate production of the capacitor 150 and hence a capacitance that can be produced within narrow tolerances. After the production of the capacitor 150, moreover, a planar surface is present in the circuit arrangement 110 and can be utilized for producing further metallization layers. As an alternative, however, the metallization layer 230 is the topmost metallization layer.

Figure 4:
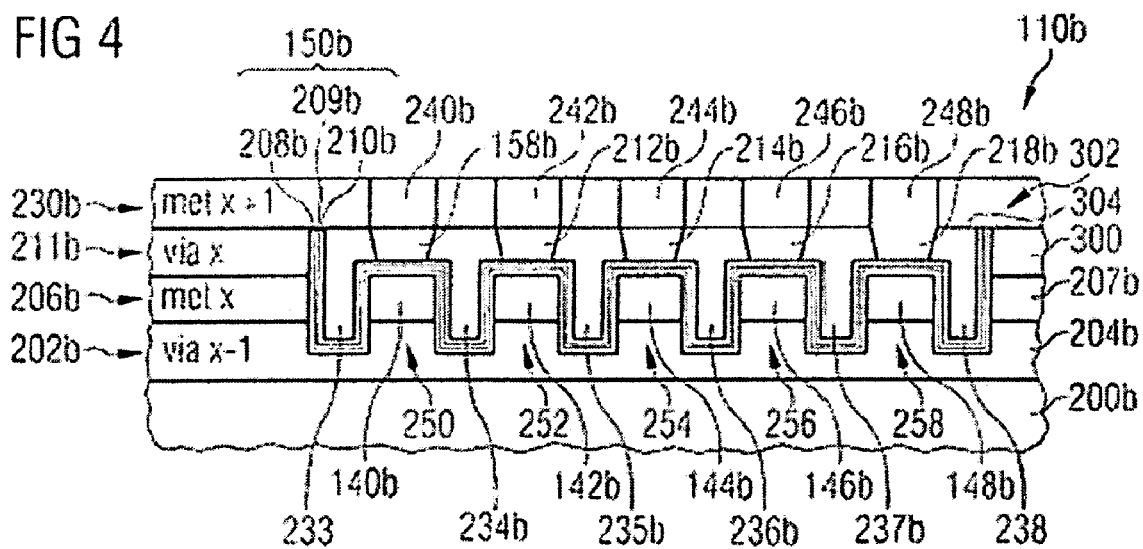
FIG. 4 illustrates a capacitor produced using a planarization method for the patterning of the capacitor and no etching stop layer.

FIG. 4 shows a circuit arrangement 110b constructed similarly to the circuit arrangement 110. Reference symbols of constituent parts of the circuit arrangement 110b corresponding to constituent parts of the circuit arrangement 110 have been given a succeeding lower-case letter "b" in FIG. 4. The constituent parts are explained again below only by way of an exception. For the rest, however, reference is made to the explanations concerning FIG. 3. Thus, the circuit arrangement 110b contains: an interconnect layer 200b, a via layer 202b with an insulating layer 204b, an interconnect layer 206b, in which interconnects 140b, 142b, 144b, 146b, and 148b are arranged and which contains an insulating layer 207b, a via layer 211b, an interconnect layer 230b, an MIM capacitor 150b having a bottom electrode 208b, a capacitor dielectric 209b and a top electrode 210b, vias 158b, 212b, 214b, 216b, and 218b, interconnects 240b, 242b, 244b, 246b, and 248b, and insulating material 234b to 237b between the interconnects 140b, 142b, 144b, 146b, and 148b.

The following process is adopted in the production of the circuit arrangement 110b: producing the interconnect layer 206b as explained above with reference to FIG. 3 for the interconnect layer 206, but no etching stop layer corresponding to the etching stop layer 205 is applied, applying an insulating layer 300 for the via layer 211b, defining a cutout 302 for the capacitor 150b using a photolithographic process, producing the cutout 302, the process stopping in the insulating layer 204b, for example with an overetching of less than 50 nm or less than 200 nm, so that the insulating layer 204b is not etched through completely. Because of the overetching, e.g. the insulating region 234 lies between two areas of the bottom electrode 208b that face away from the capacitor dielectric, the areas in each case being delimited toward the top by a recessed edge of the capacitor 150b or more precisely of the bottom electrode 208b and toward the bottom by a projecting edge of the capacitor 150b. The two areas additionally enclose the interconnect 140b.

Next, application of the bottom electrode 208b, e.g. made of titanium nitride, of the capacitor dielectric 209b, e.g. silicon nitride, and of the top electrode 210b, e.g. made of titanium nitride is performed. Insulating material 304 having a layer thickness which corresponds at least to the thickness of the metallization layer 206b plus the thickness of the via layer 211b plus a reserve thickness is deposited, forming insulating regions 233, 233b to 237b and 238. The insulating material 304 is planarized, the material for the top electrode 210b, the capacitor dielectric 209b and the bottom electrode 208b being removed outside the cutout 302. The insulating material for the interconnect layer 230b is deposited, and the conductive structures are formed in the interconnect layer 230b and in the via layer 211b by a dual damascene method.

As an alternative, the vias in the via layer 211b are produced by a single damascene method. Afterward, the interconnects of the interconnect layer 230b are also produced by a single damascene method.

In another arrangement, the production of the circuit arrangement 110b also involves the use of an etching stop layer corresponding to the etching stop layer 205 between the via layer 202b and the interconnect layer 206b, so that no insulating regions 250b, 252b, 254b, 256b, and 258b arise.

In the production of the circuit arrangement 110b, only one additional photolithography step is required for producing the capacitor 150b in comparison with producing the capacitor 150, namely for producing the cutout 302. However, the planarization step for planarizing the capacitor 150b is to be performed particularly carefully in order to avoid short circuits between the bottom electrode 208b and the top electrode 210b. By way of example, the capacitor dielectric 209b must be formed with an appropriate thickness.

On account of the patterning of the capacitor 150b with the aid of a planarization step, insulating regions 233 and 238 arranged in depressions formed by the top electrode 210b also arise at the edge of the capacitor 150b. Because of the overetching during the production of the cutout 302, insulating regions 250 to 258 or projections lying beneath the interconnects 140b, 142b, 144b, 146b, and 148b are produced in the insulating layer 204b. After the production of the capacitor 150b, these regions are laterally delimited by sections of the bottom electrode 208b. As a result of the overetching, the capacitance of the capacitor 150b is increased again with the contour remaining the same.

Figure 5:
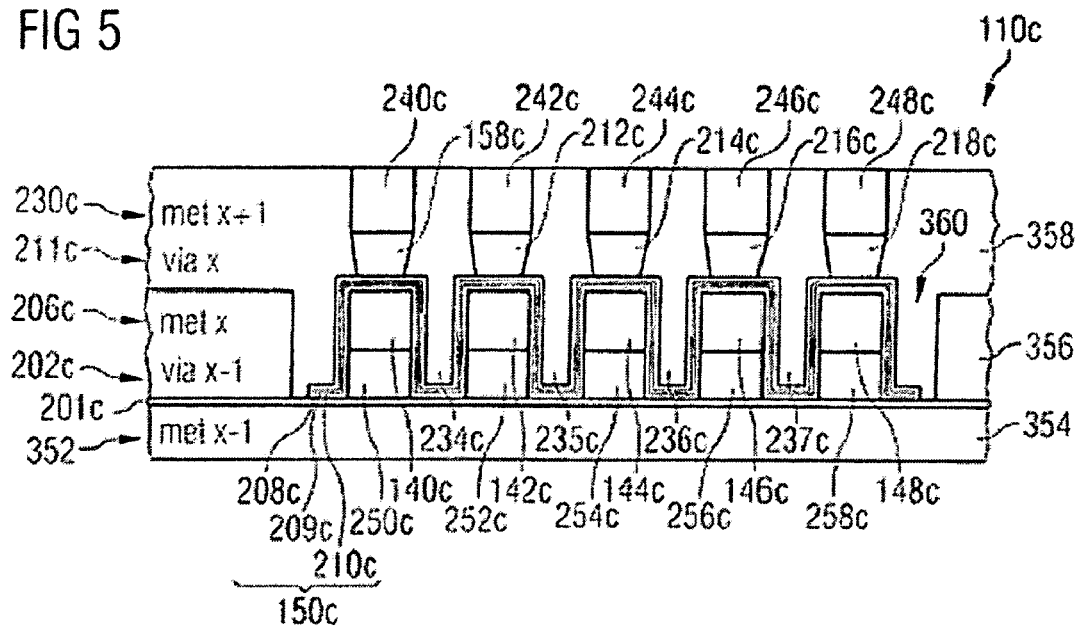
FIG. 5 illustrates a capacitor produced using a photolithographic method for the patterning of the capacitor, the capacitor extending through a plurality of conductive structure layers.

FIG. 5 shows a circuit arrangement 110c containing a multiplicity of constituent parts corresponding to constituent parts of the circuit arrangement 110 and 110b. For differentiation purposes, the lower-case letter "c" is attached to reference symbols of these constituent parts, or the lower-case letter "b" is replaced by the lower-case letter "c". These constituent parts will not be explained again below, so that reference is made to the explanations concerning FIG. 3 and concerning FIG. 4. The following constituent parts are affected, in particular: a via layer 202c or viax–1, insulating regions 250c, 252c, 254c, 256c, and 258c in the via layer 202c, an interconnect layer 206c or met x with interconnects 140c, 142c, 144c, 146c, and 148c, a capacitor 150c having a bottom electrode 208c, a capacitor dielectric 209c and a top electrode 210c, a via layer 211c or via x with vias 158c, 212c, 214c, 216c, and 218c, and an interconnect layer 230c with interconnects 240c, 242c, 244c, 246c, and 248c.

Up to the production of a metallization layer 352 with an insulating layer 354 corresponding to the metallization layer 200 and 200b, the process adopted is as explained above with reference to FIGS. 3 and 4. The interconnect layer 352 contains an insulating layer 354. The following method steps are then performed: an optional etching stop layer 210c is applied directly on the underlying interconnect layer 352, for example a silicon nitride layer; the via layer 202c and the interconnect layer 206c are produced by a dual damascene method, insulating material 356 being applied for both layers, and the interconnects 140c to 148c arising; then a first photolithographic method is performed for producing a cutout 360 for the capacitor 150c; etching of the cutout 360, the interconnects 140c to 148c serving as a hard mask and etching being effected as far as the etching stop layer 201c. This gives rise to insulating regions 50c, 252c, 254c, 256c, and 258c separated from one another beneath the interconnects 140c to 148c.

The bottom electrode 208c is deposited, the capacitor dielectric 209c and the top electrode 210c, reference being made to the introduction to the description and to FIGS. 3 and 4 with regard to the materials and the layer thicknesses, and a second photolithographic method is performed for patterning the capacitor 150c, reference being made to the explanations concerning FIG. 3.

An insulating material 358 is deposited, such as an oxide, in particular silicon dioxide, having a thickness resulting from the thickness of the dielectric material for the via layer 202c, for the interconnect layer 206c, for the via layer 211c and for the metallization layer 230c. If appropriate, a planarization reserve is additionally provided as well. The insulating material 358 is planarized as far as a thickness corresponding to the thickness of the via layer 211c and the interconnect layer 230c outside the capacitor 150c and the conductive structures are formed for the via layer 211c and for the interconnect layer 230c by a dual damascene method, the vias 158c, 212c, 214c, 216c, and 218c and the interconnects 240c, 242c, 244c, 246c, and 248c being produced, inter alia.

In an example arrangement, the capacitor 150c has a capacitance that is greater by a factor of 3 than that of a comparable planar capacitor with the same contour, assuming that the height of the via layer 202c and of the interconnect layer 206c is equal to a minimum width of the interconnects 140c, 142c, 144c, 146c, and 148c and equal to the interspace between said interconnects.

In other example arrangements, the cutout 360 is etched even deeper, through even more metallization layers, to further increase the capacitance of the capacitor 150c given the same contour.

Figure 6:
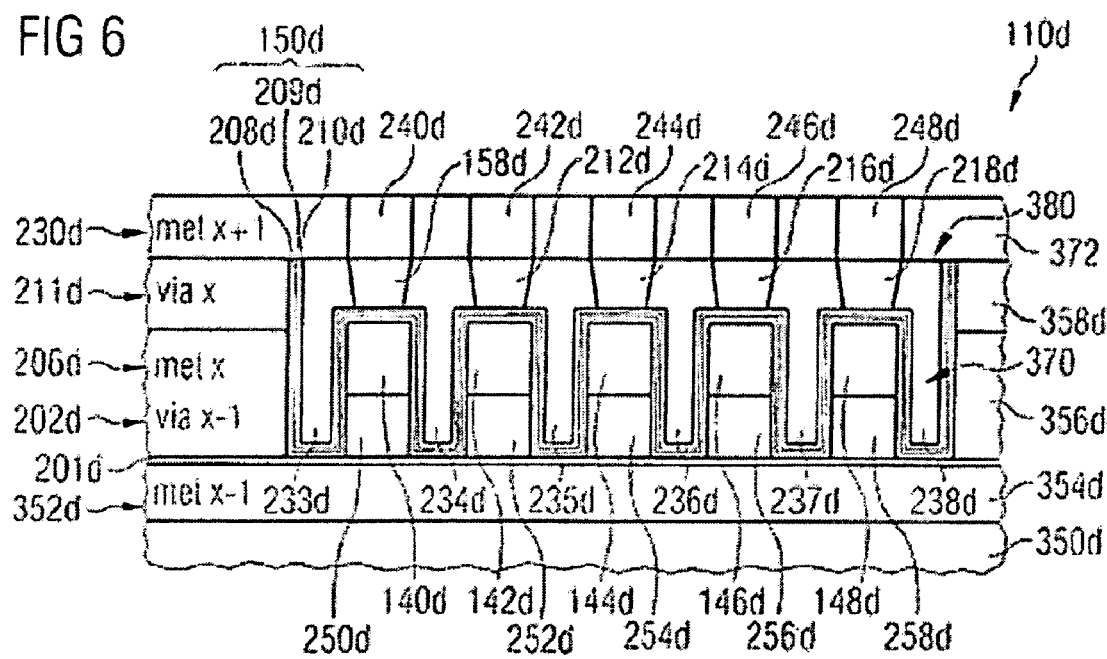
FIG. 6 illustrates a capacitor produced using an etching stop layer beneath a via layer, the capacitor having been patterned with the aid of a planarization step.

FIG. 6 shows a circuit arrangement 110d, which corresponds to the circuit arrangement 110c apart from the differences explained below. Before the production of a cutout 380 corresponding to the cutout 360, an insulating layer 358d for the via layer 211d is applied to the already completed interconnect layer 206d. Then only one additional photolithographic method is carried out for producing the capacitor 150d, the cutout 380 being produced, which extends as far as an etching stop layer 201d corresponding to the etching stop layer 201c through the via layer 211d, through the interconnect layer 206d and through the via layer 202d. The bottom electrode 208d, the capacitor dielectric 209d and the top electrode 210d of the capacitor 150d are subsequently deposited, for example a layer sequence of titanium nitride, silicon nitride, titanium nitride, and an insulating material 370 is deposited, which also forms the insulating regions 233d to 238d in the depressions formed by the top electrode 210d of the capacitor 150d. The thickness of the insulating material 370 results for example from the sum of the thickness of the via layer 202d, the thickness of the interconnect layer 206d and the thickness of the via layer 211d plus, if appropriate, a reserve for the planarization.

A planarization step is carried out in order to remove the insulating material 370, the material of the bottom electrode 208d, the capacitor dielectric 209d and the material of the top electrode 210d outside the cutout 380. An insulating material 372 for the interconnect layer 230d is deposited, and the via layer 211d and the interconnect layer 230d are patterned with the aid of a dual damascene method, by way of example.

The method in accordance with FIG. 6 results in a highly dimensionally accurate capacitor 150d with only one additional photolithographic step. The capacitance can be increased by a factor of 3 in comparison with a planar capacitor having the same contour.

Figure 7:
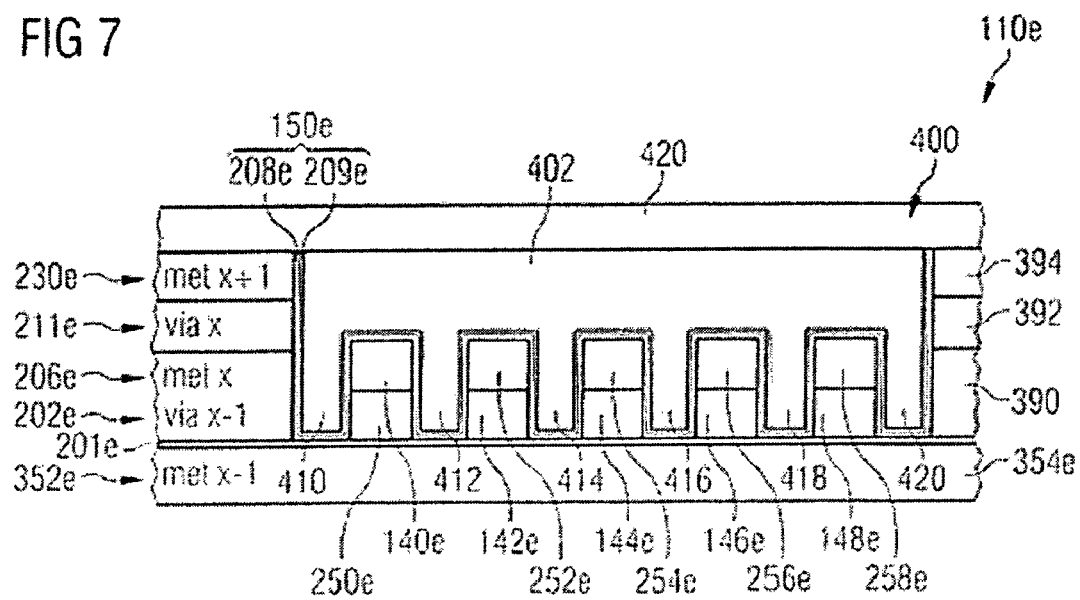
FIG. 7 illustrates a capacitor with a whole-area connection of a top electrode.

FIG. 7 shows a circuit arrangement 110e, which, apart from the differences explained below, contains a multiplicity of constituent parts that have already been explained with reference to FIG. 6, that is to say the circuit arrangement 110d. The constituent parts will not be explained again. For differentiation purposes, the reference symbols of these constituent parts contain the lower-case letter "e", however, instead of the succeeding lower-case letter "d". A thin top electrode corresponding to the top electrode 210d is optionally present or absent in the case of the capacitor 150e, because a cutout 400 corresponding to the cutout 380 is not filled with insulating material but rather with copper or a copper alloy. Accordingly, the insulating material 233d to 238d is also replaced by material in copper regions 410, 412, 414, 416, 418, and 420 which is interlinked with the material of the interconnect 140e, 142e, 144e, 146e, and 148e. Moreover, the cutout 400 also penetrates through an interconnect layer 230e corresponding to the interconnect layer 230d, so that the edges of the bottom electrode 208e, of the capacitor dielectric 209e and, if appropriate, an additional top electrode of the capacitor 150e also extend through the interconnect layer 230e at the edge of the cutout 400.

The following procedure is adopted in the production of the circuit arrangement 110e: damascene methods are applied up to the production of the interconnect layer 352e, which is also designated as met x−1; an etching stop layer 201e is optionally deposited; damascene methods are applied up to the polishing of the copper of the interconnect layer 206e, and the insulating material for the via layer 211e and for the interconnect layer 230e is deposited.

A single additional photolithography step for producing the cutout 400 for the capacitor 150e is applied, with etching being effected as far as the etching stop layer 201e. The bottom electrode 208e and of the capacitor dielectric 209e are deposited. Lithography and etching of other cutouts for conductive structures in the via layer 211e and in the interconnect layer 230e is applied.

Then copper deposition occurs, with the cutout 400 and also the other cutouts filled as far as the top area of the metallization layer 230e, and planarization of the deposited copper is performed, with the top electrode 402 of the capacitor 150e being produced in the cutout 400. This planarization also removes material of the capacitor dielectric 209e and material of the bottom electrode 208e of the capacitor 150e outside the cutout 400, so that the capacitor 150e is patterned. A further production of the circuit arrangement 110e in accordance with known methods, in particular production of, if appropriate, further metallization layers and external connections are applied.

The circuit arrangement 110e contains a capacitor 150e having a low series resistance, a high quality factor and a reduced process complexity. During planarizing the top electrode 402, it is necessary to avoid so-called "dishing", that is to say a hollowing out of the copper material 402 in the cutout 400. This can be achieved, by way of example, by not exceeding a predetermined maximum lateral width for the capacitor 150e relative to its contour. However, other measures can also be implemented.

In another example arrangement, the capacitor 150e is produced in such a way that the cutout 400 only reaches into the interconnect layer 206e, for example using an etching stop layer between the via layer 202e and the interconnect layer 206e, or without such an etching stop layer with only a small overetching of, for example, less than 50 nm.

In other example arrangements relating to capacitors in accordance with all FIGS. 3 to 7, the cutouts for the capacitor are also etched through more than two metallization layers in order to further increase the capacitance of the capacitor given the same contour and the same dielectric.

The methods explained with reference to FIGS. 1 to 7 can be carried out in the context of known damascene methods by means of only small deviations or with only a few additional steps. With the use of aluminum, or an aluminum alloy instead of copper or a copper alloy, the same structures as explained above with reference to FIGS. 1 to 6 arise in further example arrangements. However, the production methods are to be modified taking into consideration the subtractive process for patterning the aluminum.

With regard to the structure shown in FIG. 3, e.g. the following method steps are carried out in the order specified: production as far as via x−1 by means of a conventional aluminum process, deposition of an aluminum layer or aluminum alloy layer (both layers are designated hereinafter by alu layer for short), patterning of the alu layer, e.g. by Reactive Ion Etching (RIE), the procedure stopping on the etching stop layer 205, whole-area deposition of the capacitor stack, patterning of the capacitor stack by a photolithographic method, introduction of insulating material for met x and via x, planarization of the insulating material, production of via fillings, e.g. made of tungsten, and whole-area deposition of a further alu layer and patterning by a subtractive method, e.g. RIE.

With regard to the structure shown in FIG. 4, e.g. the following method steps are carried out in the order specified: production as far as via x−1 by a conventional aluminum process, and deposition of an alu layer, patterning of the alu layer, e.g. by RIE (Reactive Ion Etching), the via x−1 dielectric 202b being used as an etching stop, that is to say that overetching by e.g. a maximum of 25 nanometers is effected. The insulating material for met x and via x is deposited, the oxide is planarized, and definition of cutout 302 for the capacitor region by a photolithographic method is performed, with insulating material being removed from the capacitor region and the cutout 302 arising, which extends at most 50 nanometers into the via x−1 dielectric 202b.

Whole-area deposition of the capacitor stack (bottom electrode, dielectric and top electrode) is performed, and deposition of an insulating material for completely filling the cutout 302 is carried out. The capacitor 150b simultaneously being patterned is planarized.

The explanations concerning the aluminum process for FIGS. 3 and 4 hold true with regard to FIG. 5, it being necessary to carry out the same modifications explained above with reference to FIG. 5 for a copper process in comparison with FIGS. 3 and 4. In particular, the following processes are applied: production as far as via x−1 by a conventional aluminum process; deposition of an aluminum layer or aluminum alloy layer (both layers are designated hereinafter by alu layer for short), patterning of the alu layer by a photolithographic method and an etching process, e.g. by of Reactive Ion Etching (RIE), the procedure stopping on the via x−1 dielectric 202c, such that the etching process etches into the layer via x−1 e.g. only by a maximum of 25 nanometers; definition of cutout 360 for the capacitor by a further photolithographic method, the procedure stopping on the etching stop layer 201c; whole-area deposition of the capacitor stack; patterning of the capacitor stack by a photolithographic method; introduction of insulating material for met x and via x; planarization of the insulating material; production of via fillings, e.g. made of tungsten; and whole-area deposition of a further alu layer and patterning by a subtractive method, e.g. RIE.

The explanations concerning the aluminum process for FIGS. 3 and 4 hold true with regard to FIG. 6, it being necessary to carry out the same modifications explained above with reference to FIG. 6 for a copper process. With regard to the structure shown in FIG. 6, e.g. the following method steps are carried out in the order specified: production as far as via x−1 by a conventional aluminum process; deposition of an alu layer; patterning of the alu layer, e.g. by RIE, the via x−1 dielectric 202d being used as an etching stop, where overetching is effected by e.g. a maximum of 25 nanometers; deposition of the insulating material for met x and via x; planarization of the oxide; definition of a cutout for the capacitor region by a photolithographic method, with insulating material being removed from the capacitor region and the cutout 380 arising, which extends as far as the etching stop layer 201d; whole-area deposition of the capacitor stack (bottom electrode, dielectric and top electrode); deposition of an insulating material 370 for completely filling the cutout 380; planarization with the capacitor 150d simultaneously being patterned.

An explanation has been given of an integrated circuit arrangement containing an undulating capacitor in a conductive structure layer, the surface area of said capacitor being enlarged in comparison with an even capacitor. The capacitor is interlinked with dielectric regions at its top side and/or its underside, so that it can be produced by methods which hardly have to be altered in comparison with customary CMP methods or other methods for producing a metallization.

It is therefore intended that the foregoing detailed description be regarded as illustrative rather than limiting, and that it be understood that it is the following claims, including all equivalents, that are intended to define the spirit and scope of this invention.

The invention claimed is:

1. An integrated circuit arrangement comprising:
a substrate including a plurality of integrated semiconductor components;
a first conductive structure layer containing a plurality of conductive structures;
a capacitor comprising a bottom electrode, a capacitor dielectric, and a top electrode comprising a first side that faces away from the capacitor dielectric, the bottom electrode comprising a different material from the conductive structures, the bottom electrode further comprising a vertical section that is substantially vertical relative to an upper surface of the substrate, wherein the vertical section of the bottom electrode projects into and adjoins to a second conductive structure layer that is arranged further away from the substrate than the first conductive structure layer;
wherein the plurality of conductive structures and at least one of interspaces between the plurality of conductive structures and a plurality of cutouts included in the conductive structures comprise an uneven area enlarged by at least 30 percent in comparison with an even area having a same contour as the capacitor;
wherein the capacitor is arranged at the uneven area, and the bottom electrode is coupled with a second electrically insulating material at a side facing away from the capacitor dielectric between the conductive structures.

2. The circuit arrangement of claim 1, further comprising a projection at the side of the bottom electrode that faces away from the capacitor dielectric, and wherein at least one of electrically conductive material and electrically insulating material is arranged in said projection.

3. The circuit arrangement of claim 2, wherein the projection comprises a plurality of projections present at the side of the bottom electrode that faces away from the capacitor dielectric.

4. The circuit arrangement of claim 1, wherein the plurality of conductive structures of the first conductive structure layer are adjoined to the side of the bottom electrode that faces away from the capacitor dielectric, and a portion of the top electrode of the capacitor present in the interspaces or in the cutouts is arranged nearer to the substrate than the plurality of conductive structures of the first conductive structure layer.

5. The circuit arrangement of claim 1, wherein, at an edge of the capacitor the bottom electrode lies parallel to a surface of the substrate at which the plurality of integrated semiconductor components are arranged.

6. The circuit arrangement of claim 1, wherein, at an edge of the capacitor, the bottom electrode lies transversely with respect to a surface of the substrate at which the plurality of integrated semiconductor components are arranged,
and wherein the edge of the capacitor at which the bottom electrode lies transversely with respect to the surface of the substrate comprises the vertical section of the bottom electrode that projects into and adjoins to the second conductive structure layer.

7. The circuit arrangement of claim 6, wherein the bottom electrode lies transversely with respect to the surface of the substrate at which the plurality of integrated semiconductor components are arranged at an angle of greater than 45°.

8. The circuit arrangement of claim 1, the second conductive structure layer comprising an upper surface and a lower surface, and wherein, at the edge of the capacitor, the bottom electrode projects into the second conductive structure layer as far as the upper surface.

9. The circuit arrangement of claim 1, wherein the conductive structure layer comprises further conductive structures arranged with a lateral offset with respect to the capacitor.

10. The circuit arrangement of claim 1, wherein at least one of the bottom electrode and the top electrode comprises ruthenium, titanium, titanium nitride, tantalum, tantalum nitride or tungsten nitride,
and wherein a thickness of the bottom electrode and the thickness of the top electrode lies within a range of 10 nm to 50 nm.

11. The circuit arrangement of claim 1, wherein the capacitor dielectric comprises silicon oxide, silicon nitride, tantalum oxide, aluminum oxide or hafnium oxide,
and wherein a thickness of the capacitor dielectric lies within a range of 10 nm to 100 nm.

12. The circuit arrangement of claim 1, wherein the conductive structures have a thickness which lies within a range of 100 nm to 2 µm.

13. The circuit arrangement of claim 1, wherein an aspect ratio of the conductive structures lies within a range of 1:0.3 to 1:5.

14. The circuit arrangement of claim 1, wherein an aspect ratio of the interspaces or cutouts lies within the range of 1:0.3 to 1:5.

15. The circuit arrangement of claim 1, wherein the bottom electrode and the conductive structures adjoin a dielectric layer, wherein a dielectric layer material differs from material between the conductive structures of the conductive structure layer.

16. The circuit arrangement of claim 15, wherein the material of between the conductive structures comprises a silicon nitride layer.

17. The circuit arrangement of claim 1, further comprising:
a depression defined at the first side of the top electrode; and
a first electrically insulating material arranged in the depression.

18. The circuit arrangement of claim 17, wherein the depression comprises a plurality of depressions present at the first side of the top electrode, wherein the first electrically insulating material is arranged in each of the plurality of depressions.

* * * * *